(12) United States Patent  
Campbell et al.

(10) Patent No.: US 7,967,062 B2
(45) Date of Patent: Jun. 28, 2011

(54) THERMALLY CONDUCTIVE COMPOSITE INTERFACE, COOLED ELECTRONIC ASSEMBLIES EMPLOYING THE SAME, AND METHODS OF FABRICATION THEREOF

(75) Inventors: Levi A. Campbell, Poughkeepsie, NY (US); Richard C. Chu, Hopewell Junction, NY (US); Michael J. Ellsworth, Jr., Lagrangeville, NY (US); Keith E. Fogel, Hopewell Junction, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1214 days.

(21) Appl. No.: 11/424,642

(22) Filed: Jun. 16, 2006

(65) Prior Publication Data

US 2007/0289729 A1    Dec. 20, 2007

(51) Int. Cl.
*F28F 7/00* (2006.01)
*H05K 7/20* (2006.01)
(52) U.S. Cl. .................................... 165/185; 165/136
(58) Field of Classification Search .......... 165/84, 165/185, 135, 136; 361/704, 705, 707, 712; 257/719, 720
See application file for complete search history.

(56) References Cited

U.S. PATENT DOCUMENTS

| | | | | |
|---|---|---|---|---|
| 4,295,151 A * | 10/1981 | Nyul et al. | ............. | 372/43.01 |
| 4,546,405 A * | 10/1985 | Hultmark et al. | ............. | 361/718 |
| 5,557,501 A * | 9/1996 | DiStefano et al. | ............. | 361/704 |
| 5,783,862 A * | 7/1998 | Deeney | ............. | 257/714 |
| 5,852,871 A | 12/1998 | Khandros | ............. | 29/843 |
| 5,989,936 A * | 11/1999 | Smith et al. | ............. | 438/106 |
| 6,037,658 A * | 3/2000 | Brodsky et al. | ............. | 257/707 |
| 6,236,098 B1 * | 5/2001 | Efland et al. | ............. | 257/467 |
| 6,292,367 B1 * | 9/2001 | Sikka et al. | ............. | 361/705 |
| 6,396,700 B1 | 5/2002 | Chu et al. | ............. | 361/705 |
| 6,542,371 B1 * | 4/2003 | Webb | ............. | 361/708 |
| 6,766,817 B2 | 7/2004 | da Silva | | |
| 6,807,059 B1 | 10/2004 | Dale | ............. | 361/703 |
| 6,828,668 B2 * | 12/2004 | Smith et al. | ............. | 257/696 |
| 6,836,962 B2 | 1/2005 | Khandros et al. | ............. | 29/844 |
| 6,918,404 B2 | 7/2005 | Dias da Silva | | |
| 7,066,586 B2 | 6/2006 | da Silva | | |
| 2002/0015288 A1 * | 2/2002 | Dibene et al. | ............. | 361/711 |
| 2005/0284926 A1 | 12/2005 | Ishikawa | ............. | 228/110.1 |
| 2005/0286234 A1 | 12/2005 | Campbell et al. | ............. | 361/719 |

* cited by examiner

*Primary Examiner* — Tho v Duong
(74) *Attorney, Agent, or Firm* — Dennis Jung, Esq.; Kevin P. Radigan, Esq.; Heslin Rothenberg Farley & Mesiti P.C.

(57) ABSTRACT

A composite interface and methods of fabrication are provided for coupling a cooling assembly to an electronic device. The interface includes a plurality of thermally conductive wires formed of a first material having a first thermal conductivity, and a thermal interface material at least partially surrounding the wires. The interface material, which thermally interfaces the cooling assembly to a surface to be cooled of the electronic device, is a second material having a second thermal conductivity, wherein the first thermal conductivity is greater than the second thermal conductivity. At least some wires reside partially over a first region of higher heat flux and extend partially over a second region of lower heat flux, wherein the first and second regions are different regions of the surface to be cooled. These wires function as thermal spreaders facilitating heat transfer from the surface to be cooled to the cooling assembly.

11 Claims, 6 Drawing Sheets

THERMALLY CONDUCTIVE COMPOSITE INTERFACE, COOLED ELECTRONIC ASSEMBLIES EMPLOYING THE SAME, AND METHODS OF FABRICATION THEREOF

TECHNICAL FIELD

The present invention relates to heat transfer mechanisms, and more particularly, to heat transfer mechanisms and cooling assemblies for removing heat generated by an electronic device. More particularly, the present invention relates to a thermally conductive composite interface, and methods of fabrication thereof, for interfacing a cooling assembly to one or more heat-generating electronic devices.

BACKGROUND OF THE INVENTION

As is well known, operating electronic devices produce heat. This heat should be removed from the devices in order to maintain device junction temperatures within desirable limits, with failure to remove the heat resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Finally, as more and more devices are packed onto a single chip, power density (Watts/$cm^2$) increases, resulting in the need to remove more power from a given size chip or module.

SUMMARY OF THE INVENTION

Cooling technologies utilize air or water to carry heat away from an electronic device, and reject the heat to the ambient. Heat sinks with heat pipes or vapor chambers are commonly used air-cooling devices while cold-plates are most predominant in water cooling approaches. With both types of cooling assemblies, it is necessary to couple the cooling assembly to the electronic device. This coupling can result in a thermal interface resistance between the cooling assembly and the electronic device. The interface coupling the cooling assembly to the electronic device should thus provide an effective thermal path for heat transfer from the electronic device to the cooling assembly.

Additionally, semiconductor processing has progressed to the point where multiple logic units and their associated control and support circuits are being located on a single integrated circuit chip. From a thermal viewpoint, this results in a device with a highly non-uniform heat flux distribution. A relatively high heat flux is generated in the processor core region(s) and a relatively low heat flux is produced in the control/support regions. For example, the core region heat flux can be as much as fifteen times greater than that of other regions. Thermal grease conduction cooling schemes are not well suited to handle such disparate fluxes. They result in an equally disparate circuit temperature distribution, and more importantly, a much higher absolute junction temperature within the high heat flux regions.

Provided herein in one aspect, is a thermally conductive composite interface for enhanced coupling of a cooling assembly to at least one heat-generating electronic device. The thermally conductive composite interface includes a plurality of thermally conductive wires comprising a first material having a first thermal conductivity, and a thermal interface material at least partially surrounding the plurality of thermally conductive wires when the thermally conductive composite interface is employed between the cooling assembly and a surface to be cooled of the at least one heat-generating electronic device. The thermal interface material includes a second material having a second thermal conductivity, wherein the first thermal conductivity of the first material is greater than the second thermal conductivity of the second material. When the thermally conductive composite interface is employed to couple the cooling assembly and the surface to be cooled, at least some thermally conductive wires of the plurality of thermally conductive wires reside partially over at least one first region of higher heat flux and extend partially over at least one second region of lower heat flux, wherein the at least one first region and the at least one second regions are different regions of the surface to be cooled. When the thermally conductive composite interface is employed to couple the cooling assembly and the surface to be cooled of the at least one heat-generating electronic device, the at least some thermally conductive wires function as thermal spreaders for facilitating heat transfer from the at least one heat-generating electronic device to the cooling assembly.

In another aspect, provided herein is a cooled electronic assembly. The cooled electronic assembly includes a cooling assembly, at least one heat-generating electronic device, and a thermally conductive composite interface. The at least one heat-generating electronic device has a surface to be cooled, which includes at least one region of higher heat flux and at least one region of lower heat flux. The thermally conductive composite interface, which couples the cooling assembly and the surface to be cooled, includes a plurality of thermally conductive wires and a thermal interface material. The plurality of thermally conductive wires comprise a first material having a first thermal conductivity, and the thermal interface material comprises a second material having a second thermal conductivity, wherein the first thermal conductivity of the first material is greater than the second thermal conductivity of the second material. The thermal interface material at least partially surrounds the plurality of thermally conductive wires and thermally interfaces the cooling assembly to the surface to be cooled. At least some thermally conductive wires of the plurality of thermally conductive wires reside partially over the at least one first region of higher heat flux and extend partially over the at least one second region of lower heat flux to function as thermal spreaders between the surface to be cooled and the cooling assembly for facilitating heat transfer from the at least one heat-generating electronic device to the cooling assembly.

In a further aspect, provided herein is a method of interfacing a cooling assembly and a surface to be cooled of at least one heat-generating electronic device. The method includes: providing a plurality of thermally conductive wires comprising a first material having a first thermal conductivity; disposing the plurality of thermally conductive wires between the cooling assembly and the surface to be cooled, with at least some thermally conductive wires of the plurality of thermally conductive wires residing partially over at least one first region of higher heat flux of the surface to be cooled and extending partially over at least one second region of lower heat flux of the surface to be cooled; and providing a thermal interface material between the cooling assembly and the surface to be cooled at least partially surrounding the plurality of thermally conductive wires and thermally interfacing the cooling assembly to the surface to be cooled, wherein the at least some thermally conductive wires function as thermal spreaders between the surface to be cooled and the cooling assembly for facilitating heat transfer from the at least one heat-generating electronic device to the cooling assembly.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Generally stated, disclosed herein is a thermally conductive composite interface for coupling a cooling assembly to one or more heat-generating electronic devices. The thermally conductive composite interface includes a plurality of thermally conductive wires or pin fins, formed of a first material having a first thermal conductivity, and a thermal interface material, which at least partially surrounds the plurality of thermally conductive wires and thermally interfaces the cooling assembly to a surface to be cooled of the one or more heat-generating electronic devices when the thermally conductive composite interface is employed between the cooling assembly and the surface to be cooled. The thermal interface material comprises a second material having a second thermal conductivity, wherein the first thermal conductivity of the first material is greater than the second thermal conductivity of the second material.

When the thermally conductive composite interface is employed to couple the cooling assembly and the surface to be cooled, the at least some thermally conductive wires of the plurality of thermally conductive wires reside partially over at least one first region of higher heat flux and extend partially over at least one second region of lower heat flux, wherein the at least one first and second regions are different regions of the surface to be cooled. In operation, the at least some thermally conductive wires function as thermal spreaders for facilitating heat transfer from the surface to be cooled to the cooling assembly.

As used herein, "electronic device" comprises any heat-generating component of, for example, a computer system or other electronic system requiring cooling. The term includes one or more of an integrated circuit chip, multiple integrated circuit chips, a single chip module or a multi-chip module, either with or without a thermal cap or thermal spreader. The "surface to be cooled" refers to a surface of the electronic device itself, or to an exposed surface of a thermal spreader, passivation layer, thermal cap or other surface in contact with the electronic device, and through which heat generated by the electronic device is to be extracted.

Before describing embodiments of the thermally conductive composite interface in detail, two embodiments of a cooled electronic assembly (each employing a different cooling assembly, and a thermally conductive composite interface) are described with reference to FIGS. 1 & 2.

As noted initially, performance of computing devices continues to dramatically improve. This phenomenon is primarily driven by the continuous reduction in transistor-length scales, which has in turn allowed greater functionality to be incorporated within the same or smaller device footprints. Since most of the electrical energy consumed by these devices is released into the ambient environment in the form of heat, the thermal management of electronic devices is a growing engineering challenge.

Figure 1:
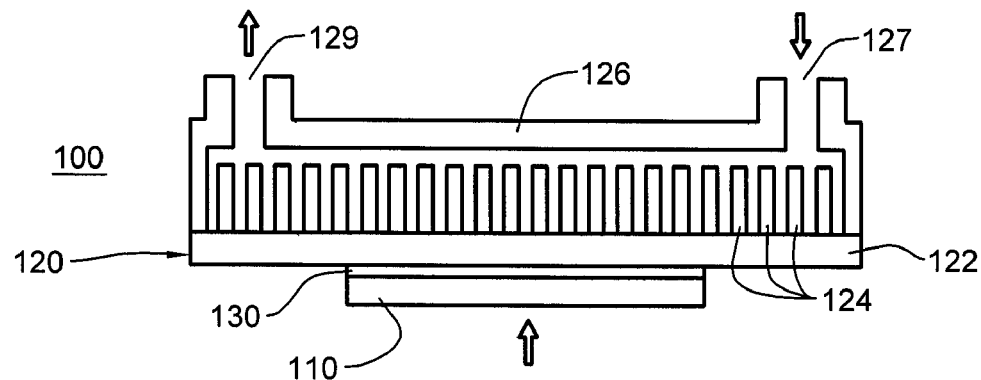
FIG. 1 is a cross-sectional elevational view of one embodiment of a liquid-cooled electronic assembly, wherein a composite interface is employed to couple the cooling assembly to the at least one heat-generating electronic component, in accordance with an aspect of the present invention.

FIG. 1 depicts one embodiment of a cooled electronic assembly, generally denoted 100, in accordance with an aspect of the present invention. In this embodiment, cooled electronic assembly 100 includes at least one electronic device 110 coupled to a cooling assembly 120 via an interface 130. More particularly, compressive loading could be employed to force cooling assembly 120 and at least one electronic device 110 together, with interface 130 sandwiched therebetween. In this example, cooling assembly is a liquid-cooled assembly, which includes a cold plate base 122 cooled by liquid coolant (e.g., cooled water) passing through a cold plate housing 126 from an inlet 127 to an outlet 129 thereof. Cold plate base 122 has projecting therefrom multiple pins or fins 124 to facilitate transfer of heat from cold plate base 122 to coolant flowing through manifold 126.

Figure 2:
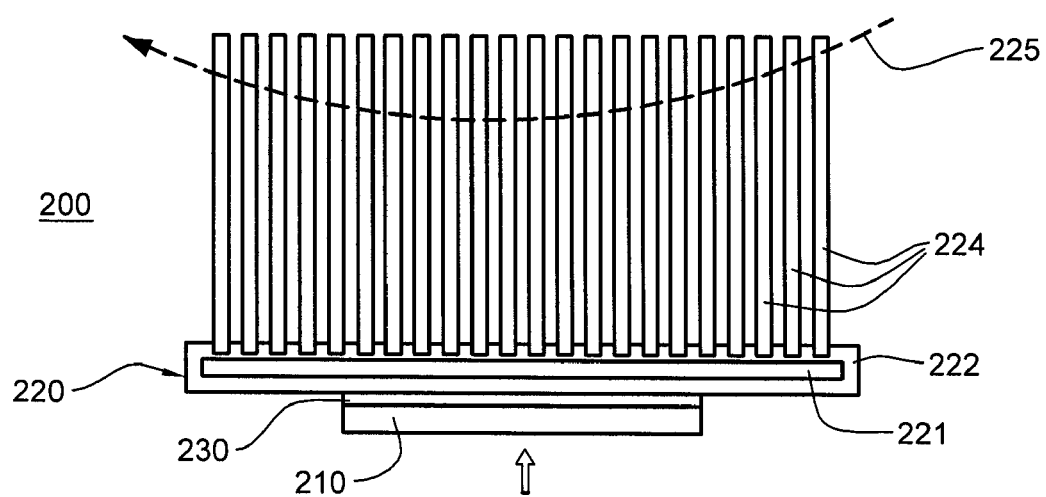
FIG. 2 is a cross-sectional elevational view of one embodiment of an air-cooled electronic assembly, wherein the cooling assembly is coupled to the at least one heat-generating electronic component employing a composite interface, in accordance with an aspect of the present invention.

FIG. 2 depicts another example of a cooled electronic assembly, generally denoted 200, in accordance with an aspect of the present invention. Cooled electronic assembly 200 includes one or more heat-generating electronic devices 210 coupled to a cooling assembly 220 via an interface 230. In this example, cooling assembly 220 is an air-cooled heat sink having a thermally conductive base 222 with a vapor chamber 221 therein. Extending from thermally conductive base 222 are a plurality of pins or fins 224, which are air-cooled 225, either actively or passively.

In both cooled electronic assembly embodiments of FIGS. 1 & 2, the cooling assembly is presented, by way of example, larger than the one or more electronic devices to be cooled in order to facilitate transfer of heat from the electronic device to the liquid coolant (in the example of FIG. 1) or ambient air (in the example of FIG. 2). Typically, air cooling is a viable option when the average chip heat flux is below 100-125 watts per square centimeter. For electronic device heat fluxes greater than 125 watts per square centimeter, liquid cooling or another aggressive cooling technique is required. In the cooled electronic assemblies of FIGS. 1 & 2, an interface 130, 230 is used to thermally couple (and if desired, structurally couple) the cooling assembly to the one or more electronic devices. This interface is conventionally formed of a thermal interface material such as thermal grease or a thermo-setting epoxy or silicone. Such materials typically have thermal conductivities in the range of 0.1-4 W/m-K.

Air-cooled cooling assemblies, as well as liquid-cooled cooling assemblies, are normally designed to meet an average heat flux cooling requirement. Traditionally, the average heat flux over the electronic device footprint has been a useful metric in determining the thermal challenge, primarily because the maximum heat flux of the electronic device has conventionally been near its average value. However, with recent advances in electronic circuit design, and particularly in microprocessor design, certain regions of the device may exhibit much higher heat fluxes than other regions, not only in steady state operation, but also when the device is switched on or off. These regions of higher heat flux are referred to as "hot spots", and they can dissipate heat fluxes that are 2-3 times greater than the average heat flux for the electronic device. This spatial non-uniformity in device heat flux results in a corresponding spatial non-uniformity in the device temperature, and can lead to maximum hot spot temperatures that are 10-20° C. higher than the device average temperature. In such cases, the cooling assembly performance is gated by this hot spot temperature. This phenomenon of hot spots is a local thermal issue, and is most effectively addressed locally. Thus, presented herein are various composite interface structures and their methods of fabrication which when employed significantly reduce hot spot temperatures by enhancing heat transfer from the high heat flux region(s) to the cooling assembly.

Figure 3A:
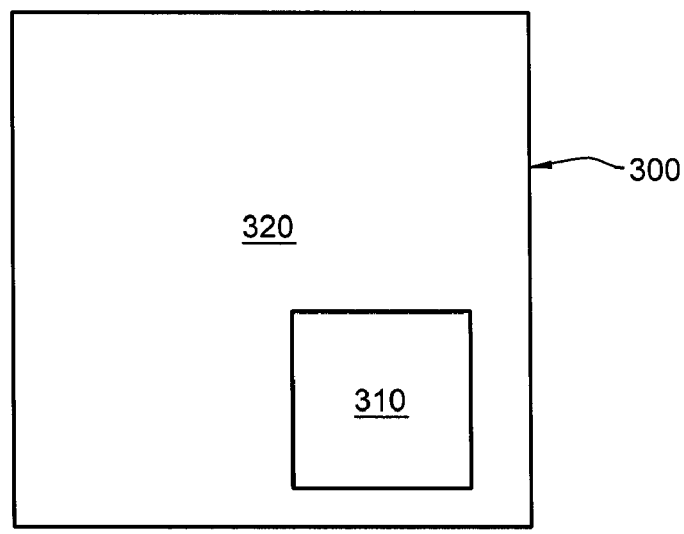
FIG. 3A is a plan view of one embodiment of a surface to be cooled of a heat-generating electronic device showing a first region of higher heat flux and a second region of lower heat flux to be interfaced for cooling, in accordance with an aspect of the present invention.

FIG. 3A depicts one example of a surface to be cooled 300 comprising a surface of or a surface attached to one or more electronic devices. In this example, the surface to be cooled includes a first region 310 of higher heat flux and a second region 320 of lower heat flux. Alternatively, multiple discrete regions 310 and/or regions 320 may exist across the surface to be cooled 300. First region 310 of higher heat flux is assumed to have a significantly higher heat dissipation rate compared with the balance of the surface, and thus, is a hot spot region.

Figure 3B:
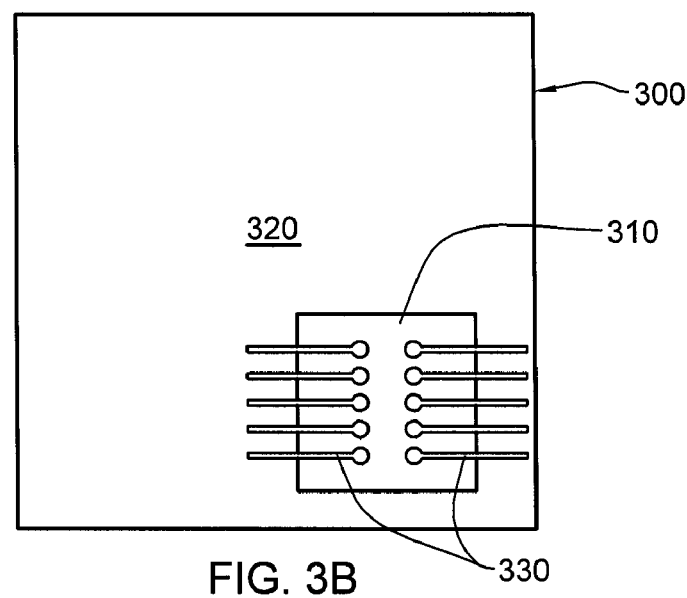
FIG. 3B is a plan view of the surface to be cooled of FIG. 3A with the addition of multiple thermally conductive wires wire-bonded to the surface to be cooled within the first region of higher heat flux and extending outward therefrom to the second region of lower heat flux, in accordance with an aspect of the present invention.

FIG. 3B depicts the structure of FIG. 3A, with the addition of a plurality of thermally conductive wires 330 (or pin fins) bonded to first region 310 of higher heat flux. As shown, the thermally conductive wires 330 are bent to reside over first region 310 and extend partially over second region 320 of lower heat flux. These wires thus function as thermal spreaders for facilitating heat transfer from the higher heat flux region of the surface to be cooled to the cooling assembly when employed as part of a composite interface between the surface to be cooled and the cooling assembly.

Figure 3C:
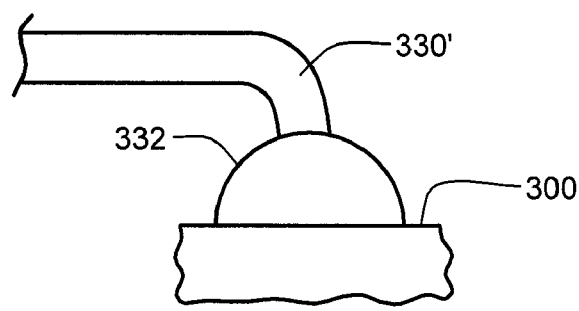
FIG. 3C is a partial enlarged elevational view of one embodiment of one thermally conductive wire wire-bonded to the surface to be cooled, in accordance with an aspect of the present invention.

FIG. 3C illustrates one example of a thermally conductive wire 330' which (as one example) is wire-bonded 332 to the surface to be cooled 300, such as the back surface of an integrated circuit chip. Current wire-bonding interconnect technology may be used to create 0.025-0.1 mm diameter wires 330' wire-bonded to the surface to be cooled within the hot spot region. By way of example, the thermally conductive wire 330' comprises a metal such as gold, copper or aluminum and has a length to diameter aspect ratio of greater than 40:1. Copper wire has a thermal conductivity of 400 W/m-K, which is approximately 100 times the thermal conductivity of today's thermal interface material, i.e., thermal grease, which has a thermal conductivity of 3-4 W/m-K. The array of thermally conductive wires is effective in reducing the temperature in the higher heat flux region of the surface to be cooled by two mechanisms, namely, by increasing the thermal conductivity of the thermal interface in the region of higher heat flux, and by radially spreading heat from the higher heat flux region to the cooler surrounding regions of lower heat flux.

Figure 4A:
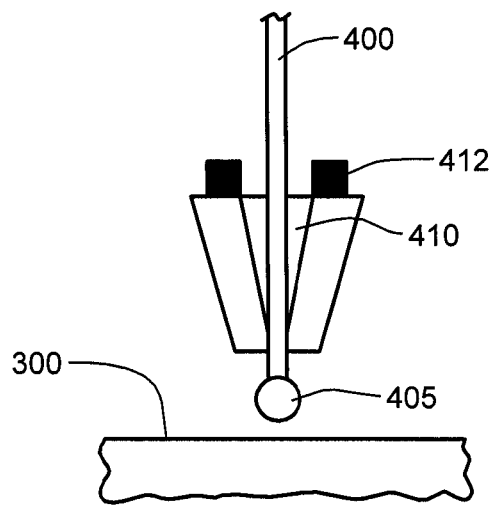
FIG. 4A is an elevational view of a thermally conductive wire to be wire-bonded to a surface to be cooled during an interface method, in accordance with an aspect of the present invention.
Figure 4B:
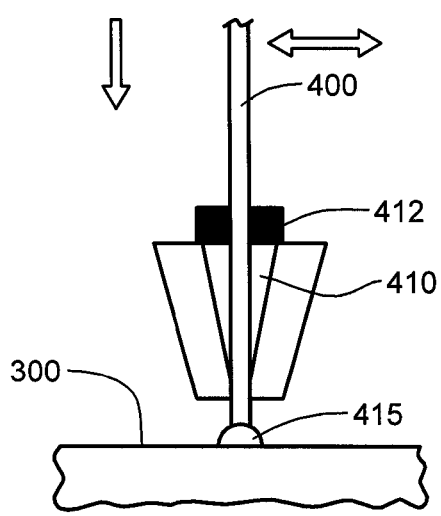
FIG. 4B depicts the structures of FIG. 4A showing the formation of a diffusion weld-bond between the wire and the surface to be cooled, in accordance with an aspect of the present invention.
Figure 4C:
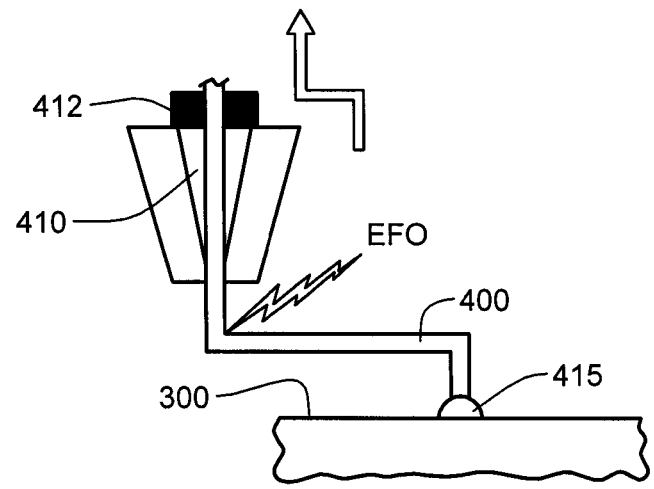
FIG. 4C depicts the structures of FIG. 4B showing the wire-bonding tool head moved up the wire, after bending of the wire, and showing the application of an electronic flame-off (EFO) to the wire to cut the wire and thereby form the discrete thermally conductive wire attached to the surface to be cooled, in accordance with an aspect of the present invention.

FIGS. 4A-4C illustrate one method of fabricating the thermally conductive wires, in accordance with an aspect of the present invention, using thermosonic ball-bonding techniques.

FIG. 4A depicts the beginning of the manufacturing process, displaying the various elements needed for the process, including a surface to be cooled 300 of one or more electronic devices, and wire 400 that is to be formed into a plurality of thermally conductive wires or pins. Wire 400 includes a ball tip 405 and the tool head that incorporates the wire-clamping mechanism includes a capillary passage 410 for the wire. Appropriate metallization (such as chrome-copper or chrome-copper-gold) is assumed to reside on the surface to be cooled 300. In FIG. 4B, the clamping mechanism of tool head 412 is shown in clamped position holding wire 400.

FIG. 4B illustrates the tool head of FIG. 4A after the ball tip of wire 400 has been brought into physical contact with the surface to be cooled. Using a controlled downward bond force in combination with ultrasonic activation, a physical environment is created that is conducive to plastic deformation and intermolecular diffusion between wire 400 and the metalized surface to be cooled. A diffusion weld-bond 415 results under these conditions, whereby the plastic deformation at microscopic length scales causes the metal to flow in slip and shear planes across each part of the wire-surface interface, thus forming a metallurgical diffusion bond.

After the bond is formed, the tool head is unclamped, and moved to a different position along the length of wire 400, during which bends are formed in the wire as shown in FIG. 4C. An electronic flame-off (EFO) operation, which is a process known in the art for cutting a wire, is then employed to sever wire 400 at the second bend in the wire, which also creates a new ball tip (not shown) to allow re-initiation of the process. (Alternatively, a notch and cut operation could be employed to server wire 400.) Numerous repetitions of the process can be performed to produce a wire array such as depicted in FIG. 3B. Those skilled in the art should note from this description that any desired wire arrangement can be accommodated. Further, although initially described as being attached to the surface to be cooled, those skilled in the art will note from this description that the plurality of thermally conductive wires could additionally or alternatively be wire-bonded to a surface of the cooling assembly.

Figure 5:
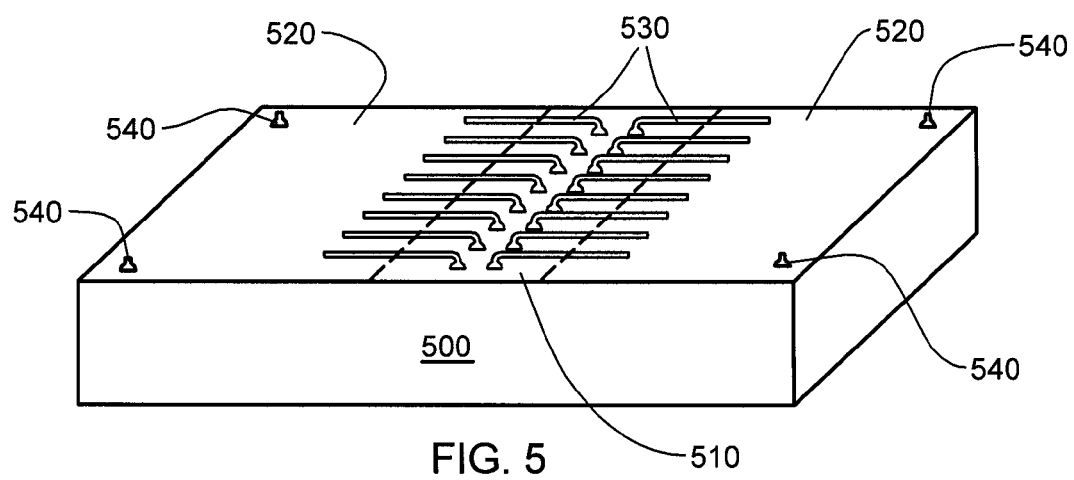
FIG. 5 is an isometric view of one embodiment of a heat-generating electronic device showing multiple thermally conductive wires wire-bonded to a first region of higher heat flux of the electronic device and extending over a second region of lower heat flux, and showing wire-bonded studs at the corners of the electronic device to provide a spacing between a cooling assembly (not shown) and the surface to be cooled when the thermally conductive composite interface is employed to couple the cooling assembly and the surface to be cooled, in accordance with an aspect of the present invention.
Figure 6:
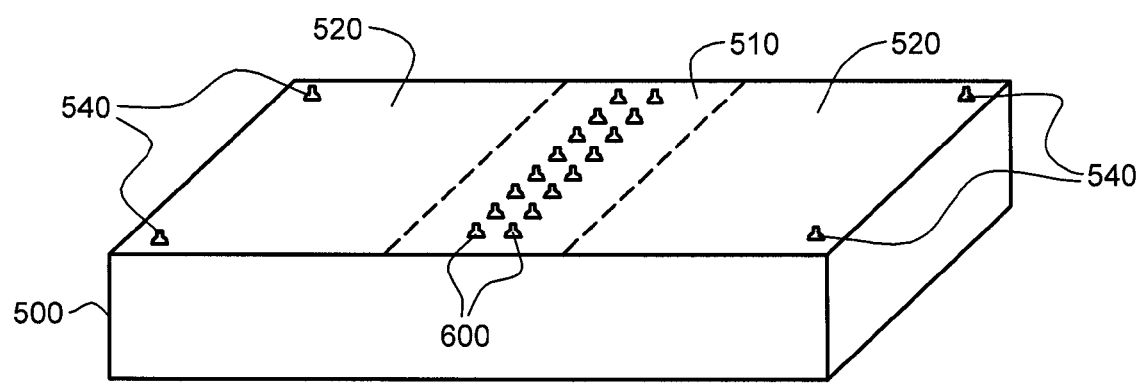
FIG. 6 is an isometric view of an alternate embodiment of a heat-generating electronic device showing multiple wire-bonded studs as stand-offs to provide a spacing between a cooling assembly (not shown) and the surface to be cooled, as well as to facilitate transfer of heat from a first region of higher heat flux of the surface to be cooled, in accordance with an aspect of the present invention.

FIG. 5 depicts an enlarged example of an electronic device 500, such as an integrated circuit chip, having a first region 510 of higher heat flux and multiple second regions 520 of lower heat flux. A plurality of wire-bonded wires 530 are attached to first region 510 of higher heat flux with the wires extending from the first region to over the second regions 520 of lower heat flux. As explained further below, the plurality of thermally conductive wires 530 are suspended at least partially within a thermal interface material when employed in the composite interface. In this example, stand-offs 540 are also provided near the corners of the electronic device to ensure reliable positioning of the cooling assembly relative to the electronic device. In one example, these stand-offs are four bumps formed at the corners of the electronic device before the thermal interface material has been added. The bumps can be created by following a similar process to that described above in connection with FIGS. 4A-4C, but with cut-off occurring close to where the ball joint is made, at a very short specific length of wire. These bump structures can be used in the hot spot region as well, as illustrated in FIG. 6, wherein a plurality of wire-bonded bumps 600 are secured to first region 510 of higher heat flux. Additionally, wire-bonded bumps 600 could be interleaved (not shown) with the plurality of thermally conductive wires 530 (FIG. 5) in any desired pattern.

FIGS. 7A-7F are partial cross-sectional elevational views of various embodiments of a thermally conductive composite interface coupling a cooling assembly 730 and a heat-generating electronic device 700. As shown, heat-generating electronic device 700 includes at least two regions, that is, a first region 710 of higher heat flux, and a second region 720 of lower heat flux. In each embodiment, a single wire 740 is shown at least partially suspended within a thermal interface material 750, such as a thermally conductive grease. Cooling assembly 730 may, e.g., comprise a cooling assembly such as described above in connection with FIGS. 1 & 2. Alternatively, cooling assembly 730 could simply comprise a metal lid, such as a copper cover, over the electronic device 700.

Figure 7A:
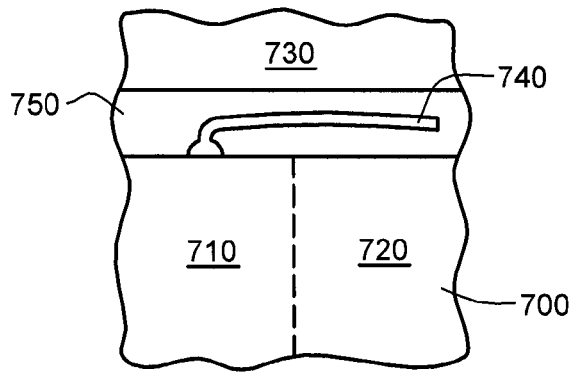
FIG. 7A is a partial cross-sectional elevational view of one embodiment of a cooled electronic assembly employing a thermally conductive composite interface to couple a cooling assembly and heat-generating electronic device, in accordance with an aspect of the present invention.

In the embodiment of FIG. 7A, a wire 740 (e.g., 1-2 mil diameter) is wire-bonded at a first end to the surface to be cooled within first region 710 of the electronic device 700. A second end of wire 740 is suspended within the thermally conductive grease 750 and extends over second region 720 of lower heat flux.

Figure 7B:
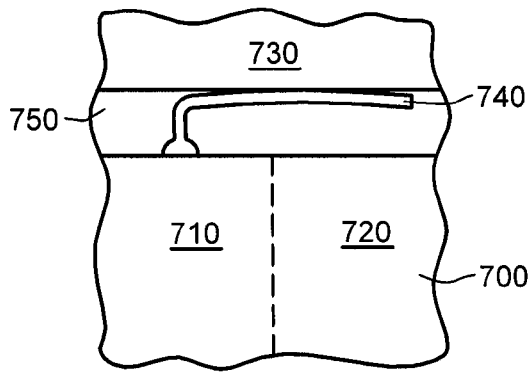
FIG. 7B is a partial cross-sectional elevational view of an alternate embodiment of a thermally conductive composite interface coupling a cooling assembly and heat-generating electronic component, in accordance with an aspect of the present invention.

FIG. 7B depicts an alternate configuration wherein thermally conductive wire 740 is again (e.g., a 1-2 mil diameter wire) wire-bonded to the surface to be cooled within first region 710 of higher heat flux. In this example, wire 740 partially contacts cooling assembly 730 and extends over second region 720 of lower heat flux.

Figure 7C:
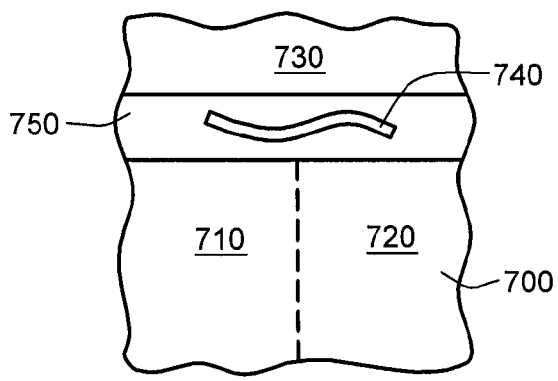
FIG. 7C is a partial cross-sectional elevational view of another embodiment of a thermally conductive composite interface coupling a cooling assembly and heat-generating electronic component, in accordance with an aspect of the present invention.

FIG. 7C depicts another embodiment wherein thermally conductive wire 740 is surrounded by thermally conductive material 750 and includes a first end which resides over first region 710 of higher heat flux and a second end which resides over second region 720 of lower heat flux. In this embodiment, no wire-bonding of wire 740 to either the surface to be cooled or the cooling assembly is employed. By way of example, thermally conductive wire 740 could comprise gold, copper, aluminum or graphite.

Figure 7D:
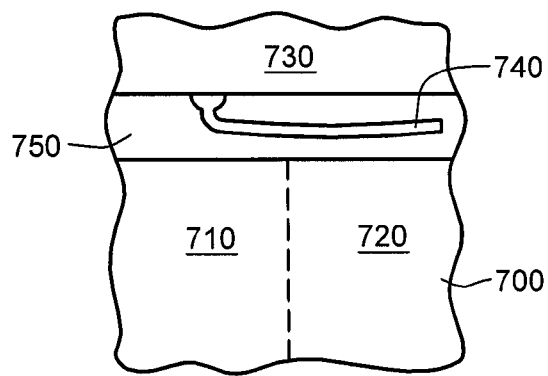
FIG. 7D is a partial cross-sectional elevational view of a further embodiment of a thermally conductive composite interface coupling a cooling assembly and heat-generating electronic component, in accordance with an aspect of the present invention.

FIG. 7D depicts an embodiment wherein thermally conductive wire 740 is wire-bonded to cooling assembly 730 aligned over first region 710 of higher heat flux of electronic device 700. The free end of thermally conductive wire 740 is suspended within thermal interface material 750 and extends over second region 720 of electronic device 700.

Figure 7E:
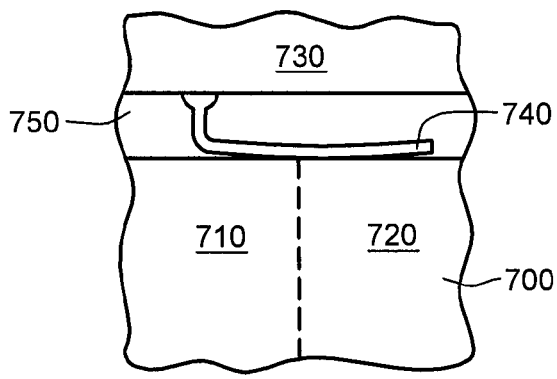
FIG. 7E is a partial cross-sectional elevational view of still another embodiment of a thermally conductive composite interface coupling a cooling assembly and heat-generating electronic component, in accordance with an aspect of the present invention.

FIG. 7E depicts a variation on the embodiment of FIG. 7D, wherein thermally conductive wire 740 at least partially physically contacts electronic device 700 to facilitate transfer and spreading of heat from first region 710 of higher heat flux into the composite interface and hence to cooling assembly 730.

Figure 7F:
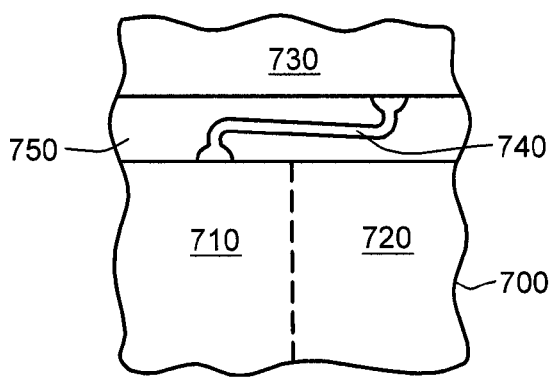
FIG. 7F is a partial cross-sectional elevational view of an alternate embodiment of a thermally conductive composite interface coupling a cooling assembly and heat-generating electronic component, in accordance with an aspect of the present invention.

FIG. 7F depicts a further variation on the composite interface, wherein thermally conductive wire 740 is attached (for example, wire-bonded) to the surface to be cooled and attached (for example, soldered) to cooling assembly 730. In the example shown, wire 740 is joined to the electronic device 700 in first region 710 of higher heat flux, and extends to a position over second region 720 of lower heat flux where wire 740 attaches to cooling assembly 730. As with the other embodiments, wire 740 is, e.g., a 1-2 mil diameter wire that is at least partially surrounded by thermal interface material 750.

Thermal analysis has been performed to evaluate the impact of a thermally conductive composite interface as described herein on maximum hot spot temperature of an integrated circuit chip. This analysis was carried out on a 10 mm by 10 mm integrated circuit chip that was 0.75 mm thick, and made of silicon (120 W/m-K), attached to a liquid-cooled cold plate via 0.076 mm (3 mils) thick thermal interface material, e.g., thermal grease (3.8 W/m-K). By way of example, 89% of the chip dissipated heat at a flux of 132 watts per square centimeter, while a hot spot was set to a heat flux of 250-350 watts per square centimeter. Without a plurality of thermally conductive wires, a maximum junction temperature of 110° C. was noted for a case with a 350 W/cm² hot spot heat flux, while with a plurality of thermally conductive wires disposed as illustrated in FIG. 3B, a maximum junction temperature of 99° C. was obtained. More specifically, in one example, the thermally conductive wire was assumed to comprise copper wire of 1 mil diameter and 2 mm in length. A quantity of 240 such wires was employed in the analysis.

Figure 8:
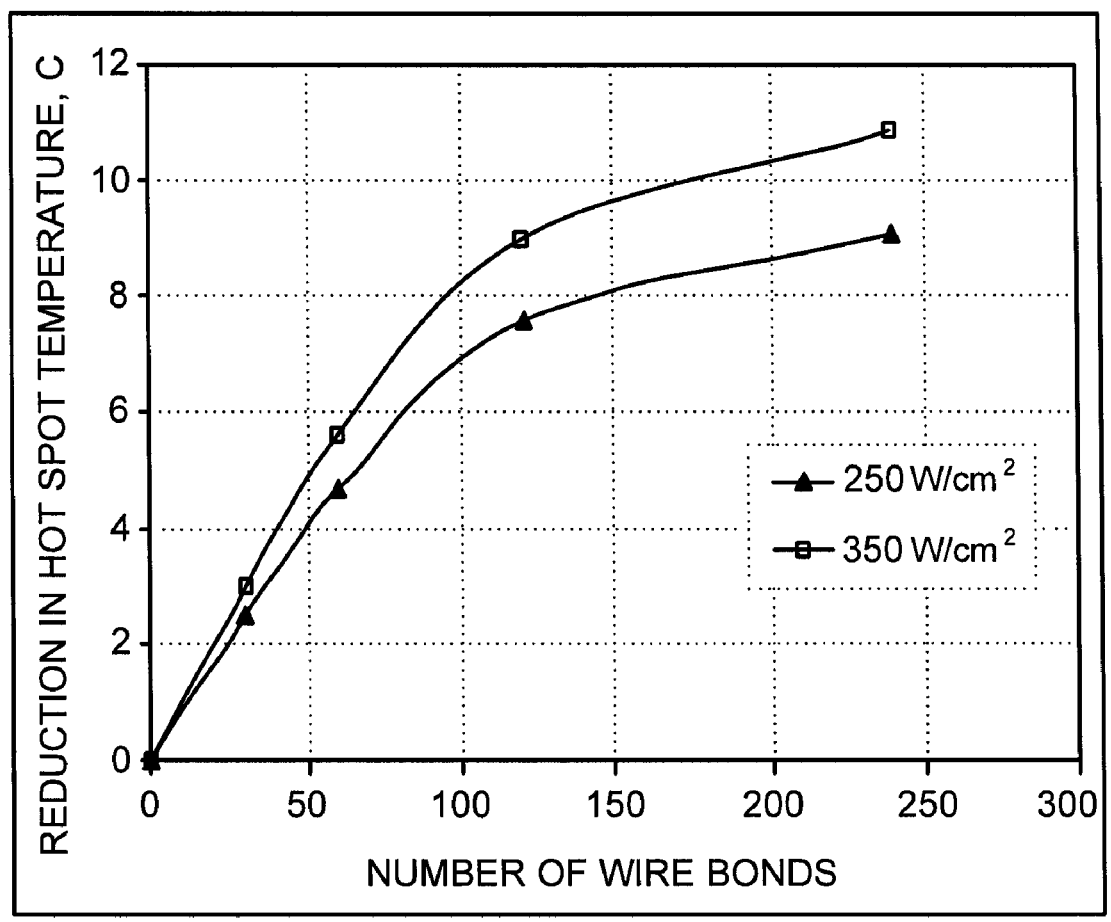
FIG. 8 is a graph showing reduction in hot spot temperature achieved at a surface to be cooled of an electronic device for different wire-bond densities of a composite interface and assuming two different regions of heat flux, in accordance with an aspect of the present invention.

FIG. 8 is a graph of the reduction in the hot spot integrated circuit chip junction temperature for several different wire-bond densities, and for two hot spot heat fluxes of 250 and 350 watts per square centimeter, respectively. The graph illustrates that adding more wires to the hot spot region results in an increased reduction in the hot spot temperature. Further, the impact of the thermally conductive composite interface disclosed herein is greater as the magnitude of the hot spot heat flux increases. The baseline hot spot temperature was 95° C. maximum for a 250 watts/cm² hot spot and 110° C. maximum for a 350 W/cm² hot spot.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A thermally conductive composite interface coupling a cooling assembly to at least one heat-generating electronic device, the thermally conductive composite interface comprising:
   a plurality of discrete, thermally conductive pin fins disposed separate from one another and comprising a first material having a first thermal conductivity;
   a thermal interface material at least partially surrounding the plurality of discrete, thermally conductive pin fins and thermally interfacing the cooling assembly to a surface to be cooled of at least one heat-generating electronic device, the thermally conductive composite interface being disposed between the cooling assembly and the surface to be cooled, and comprising a second material having a second thermal conductivity, wherein the first thermal conductivity of the first material is greater than the second thermal conductivity of the second material; and
   wherein the thermally conductive composite interface physically and thermally couples the cooling assembly and the surface to be cooled, and at least some discrete, thermally conductive pin fins of the plurality of discrete, thermally conductive pin fins are each separately wire-bonded at only one end to at least one of a surface of the cooling assembly or the surface to be cooled over at least one first region of higher heat flux of the surface to be cooled and unattached at the other end, and extend towards and partially over at least one second region of lower heat flux of the surface to be cooled, the at least one first region and the at least one second region comprising different regions of the surface to be cooled of the at least one heat-generating electronic device, each separate wire bond being a metallurgical diffusion bond of the discrete, thermally conductive pin fin at only one end thereof to the at least one of the surface of the cooling assembly or the surface to be cooled, and wherein the at least some discrete, thermally conductive pin fins are disposed to conduct and locally spread heat, thereby facilitating heat transfer from the surface to be cooled of the at least one heat-generating electronic device to the cooling assembly.

2. The thermally conductive composite interface of claim 1, wherein the at least some discrete, thermally conductive pin fins are partially horizontally suspended within the thermal interface between the cooling assembly and the surface to be cooled of the at least one heat-generating electronic device.

3. The thermally conductive composite interface of claim 1, wherein each discrete, thermally conductive pin fin of the plurality of discrete, thermally conductive pin fins is wire-bonded at only one end to at least one of the surface of the cooling assembly or the surface to be cooled of the at least one heat-generating electronic device and unattached at the other end.

4. The thermally conductive composite interface of claim 1, wherein the first material of the plurality of thermally conductive wires comprises at least one of gold, copper, aluminum or graphite, and wherein the second material of the thermal interface material comprises one of a thermally conductive grease, an epoxy, an elastomer material or a liquid metal.

5. The thermally conductive composite interface of claim 1, wherein the first thermal conductivity of the first material is greater than ten times the second thermal conductivity of the second material, and wherein the at least one heat-generating electronic device comprises at least one of an integrated circuit chip, multiple integrated circuit chips, a single chip module or a multi-chip module.

6. The thermally conductive composite interface of claim 1, further comprising multiple wire-bonded studs attached to at least one of the surface of the cooling assembly or the surface to be cooled of the at least one heat-generating electronic device when the thermally conductive composite interface is employed to couple the cooling assembly and the surface to be cooled, and wherein each wire-bonded stud is shorter in length than the plurality of discrete, thermally conductive pin fins and is at least one of:
   configured as a stand-off to provide a spacing between the cooling assembly and the surface to be cooled when the thermally conductive composite interface is employed to couple the cooling assembly and the surface to be cooled; or
   aligned over the at least one first region of higher heat flux of the surface to be cooled of the at least one heat-generating electronic device to facilitate transfer of heat therefrom.

7. A cooled electronic assembly comprising:
   a cooling assembly comprising a surface;
   at least one heat-generating electronic device including a surface to be cooled, wherein the surface to be cooled includes at least one first region of higher heat flux and at least one second region of lower heat flux; and
   a thermally conductive composite interface coupling the cooling assembly and the surface to be cooled, the thermally conductive composite interface comprising:
   a plurality of discrete, thermally conductive pin fins disposed separate from one another and comprising a first material having a first thermal conductivity;
   a thermal interface material at least partially surrounding the plurality of discrete, thermally conductive pin fins and thermally interfacing the cooling assembly to the surface to be cooled of the at least one heat-generating electronic device, the thermal interface material comprising a second material having a second thermal conductivity, wherein the first thermal conductivity of the first material is greater than the second thermal conductivity of the second material; and wherein at least some discrete, thermally conductive pin fins of the plurality of discrete, thermally conductive pin fins are each separately wire-bonded at only one end to at least one of the surface of the cooling assembly or the surface to be cooled over the at least one first region of higher heat flux and is unattached at the other end, and extends towards and partially over the at least one second region of lower heat flux to function as a local thermal spreader between the surface to be cooled and the cooling assembly for facilitating heat transfer from the at least one heat-generating electronic device to the cooling assembly, wherein each separate wire bond is a metallurgical diffusion bond of the discrete, thermally conductive pin fin at only one end thereof to the at least one of the surface of the cooling assembly or the surface to be cooled.

8. The cooled electronic assembly of claim 7, wherein the at least some discrete, thermally conductive pin fins are partially horizontally suspended within the thermal interface material.

9. The cooled electronic assembly of claim 7, wherein the first material of the plurality of thermally conductive wires comprises at least one of gold, copper, aluminum or graphite, and wherein the second material of the thermal interface material comprises one of a thermlly conductive grease, an epoxy, an elastomer material or a liquid metal.

10. The cooled electronic assembly of claim 7, wherein the first thermal conductivity of the first material is greater than ten times the second thermal conductivity of the second material, and wherein the at least one heat-generating electronic device comprises at least one of an integrated circuit chip, multiple integrated circuit chips, a single chip module or a multi-chip module.

11. The cooled electronic assembly of claim 7, further comprising multiple wire-bonded studs attached to at least one of the surface of the cooling assembly or the surface to be cooled of the at least one heat-generating electronic device, and wherein each wire-bonded stud is shorter in length than the plurality of discrete, thermally conductive pin fins and is at least one of:

configured as a stand-off to provide a spacing between the cooling . assembly and the surface to be cooled; and aligned over the at least one first region of higher heat flux of the surface to be cooled to facilitate transfer of heat therefrom.

\* \* \* \* \*